(12) United States Patent
Inoue et al.

(10) Patent No.: US 8,318,566 B2
(45) Date of Patent: Nov. 27, 2012

(54) METHOD TO SEPERATE STORAGE REGIONS IN THE MIRROR BIT DEVICE

(75) Inventors: Fumihiko Inoue, Fukushima-Ken (JP); Haruki Souma, Fukushima-Ken (JP); Yukio Hayakawa, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/156,122

(22) Filed: Jun. 8, 2011

(65) Prior Publication Data

US 2011/0233651 A1    Sep. 29, 2011

Related U.S. Application Data

(62) Division of application No. 12/195,324, filed on Aug. 20, 2008, now Pat. No. 8,003,468.

(30) Foreign Application Priority Data

Aug. 20, 2007  (JP) ................................. 2007-214097

(51) Int. Cl.
*H01L 21/336* (2006.01)

(52) U.S. Cl. ........ 438/288; 438/128; 438/261; 438/637; 257/314; 257/E21.18; 257/E21.21

(58) Field of Classification Search .................. 438/280, 438/288; 257/E21.18

See application file for complete search history.

(56) References Cited

U.S. PATENT DOCUMENTS

2008/0239789 A1    10/2008   Shino

*Primary Examiner* — Cheung Lee

(57) ABSTRACT

Devices and methods for isolating adjacent charge accumulation layers in a semiconductor device are disclosed. In one embodiment, a semiconductor device comprises a bit line formed in a semiconductor substrate, a charge accumulation layer formed on the semiconductor substrate, a word line formed on the charge accumulation layer across the bit line, and a channel region formed in the semiconductor substrate below the word line and between the bit line and its adjacent bit line. For the semiconductor device, the charge accumulation layer is formed above the channel region in a widthwise direction of the word line, and a width of the word line is set to be narrower than a distance between an end of the channel region and a central part of the channel region in a lengthwise direction of the word line.

12 Claims, 14 Drawing Sheets

FIG. 4A
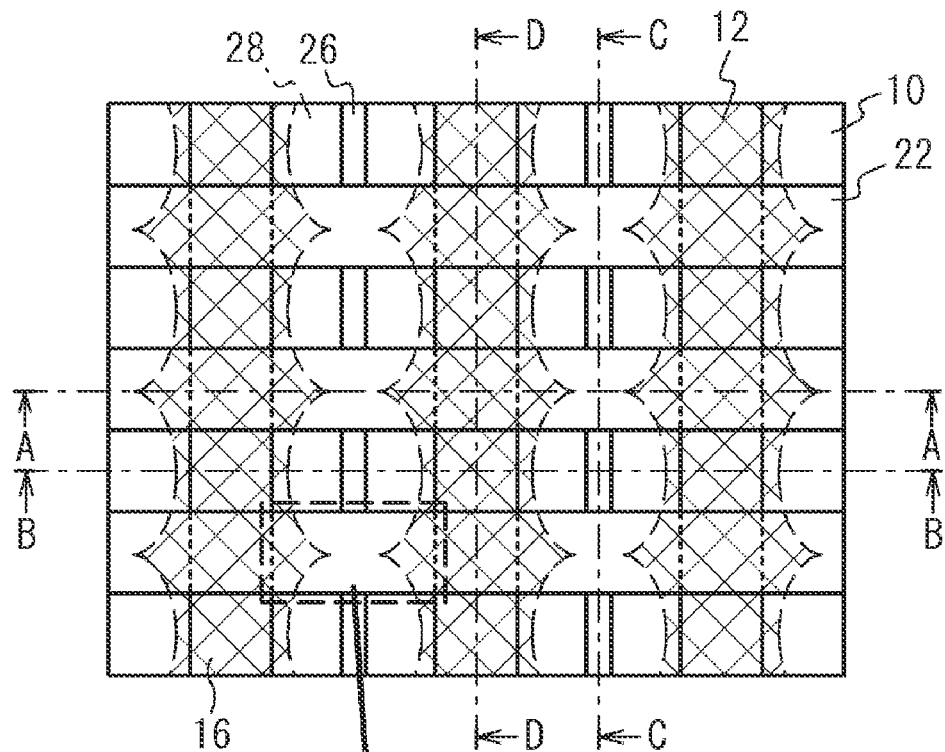
FIG. 4B  ENLARGED
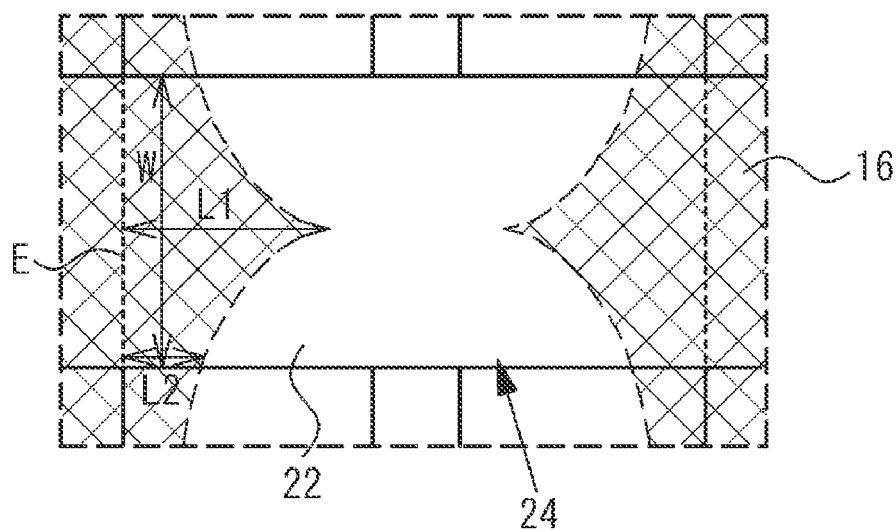

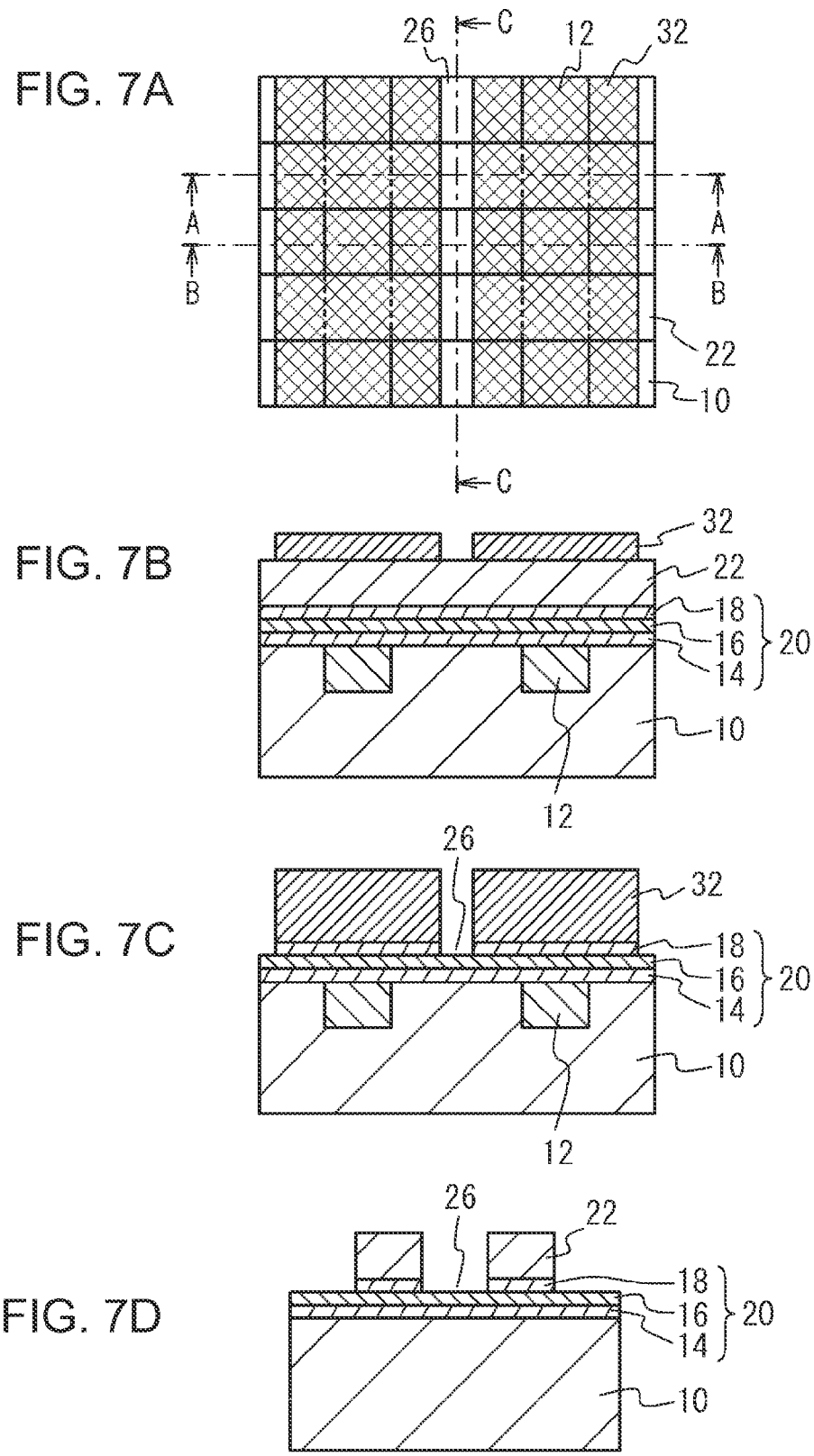

METHOD TO SEPERATE STORAGE REGIONS IN THE MIRROR BIT DEVICE

CLAIM OF PRIORITY

This application is a Divisional Application of and claims priority to U.S. application Ser. No. 12/195,324, filed Aug. 20, 2008, which claims the priority benefit of JP Application No. 2007-214097, filed Aug. 20, 2007, which is hereby incorporated in its entirety.

FIELD OF TECHNOLOGY

The present invention relates to semiconductor devices and methods, particularly to data storage layers of semiconductor memory devices.

BACKGROUND

In a flash memory, a transistor that configures a memory cell includes a charge accumulation layer of either a floating gate or an insulating film. The memory cell stores data by accumulating electrons in the charge accumulation layer. A silicon-oxide-nitride-oxide-silicon (SONOS) structure flash memory accumulates electrons in a nitride film of an oxide-nitride-oxide (ONO) film. U.S. Pat. No. 6,011,725 discloses a virtual ground flash memory having a virtual ground memory cell which is symmetrically operated by switching around a source and a drain.

FIG. 1A is a schematic top view of a conventional flash memory, and FIG. 1B is a schematic cross-sectional view taken along the line A-A of FIG. 1A. In FIG. 1A, a bit line 12 is shown through an ONO film 20. In FIG. 1A and FIG. 1B, the bit line 12 is formed in a semiconductor substrate 10. The ONO film 20 made of a tunnel insulating film 14, a charge accumulation layer 16, and a top insulating film 18 are formed on the semiconductor substrate 10. A word line 22 is formed on the ONO film 20 across the bit lines 12. The bit line 12 functions as either a source or a drain, and the word line 22 functions as a gate. A channel region 24 is formed at an area in the semiconductor substrate 10 between the bit lines 12 and below the word line 22.

By applying a high electric field between the source (B1) and the drain (B2), electrons flow through the channel region 24. In addition, electrical charges are accumulated in a charge accumulation region C1 of the charge accumulation layer 16. By switching around the source and the drain, electrical charges are accumulated in a charge accumulation region C2. As described above, by symmetrically operating the source and the drain, two charge accumulation regions can be formed in the charge accumulation layer 16 of a single transistor. Consequently, in one transistor, two bits can be stored.

In recent years, a demand for integration and miniaturization of memory cells has increased. In order to accommodate the trend, the space between the bit lines 12 or the distance between B1 and B2 needs to be narrowed. With the reduced space between the bit lines 12, the charge accumulation region C1 and the charge accumulation region C2 become close to each other. Consequently, isolating the two chare accumulation regions C1 and C2 becomes difficult. Due to the closeness of the two charge accumulation regions C1 and C2, the charges accumulated in the charge accumulation region C1 and in the charge accumulation region C2 interfere with each other. This is known as a complementary bit disturb (CBD).

FIG. 2A and FIG. 2B describe cross sectional views of a NAND flash memory designed to prevent charges accumulated in charge accumulation regions from interfering with each other. FIG. 3 is a schematic top view of the NAND flash memory illustrated in FIG. 2A and FIG. 2B. In FIG. 3, the charge accumulation layer 16 and such are omitted in the drawing.

In FIG. 3, an element isolating region 13, which is the cross-hatched area, is used to isolate source-drain regions 15 in the semiconductor substrate 10. In FIG. 2A, an oxide film 11 is formed on the semiconductor substrate 10. Then, the word line 22 is formed on the oxide film 11, and the charge accumulation layers 16 are formed at the periphery of the oxide film 11, as illustrated in FIG. 2B. In FIG. 2B, the word line 22 is formed on the oxide film 11.

As shown in FIG. 3, in the NAND flash memory, the source-drain regions 15 flank the word line 22. Therefore, an area between the source-drain regions 15 in the widthwise direction of the word line 22 becomes the channel region 24. Consequently, at both ends of the word line 22 adjacent to the source-drain regions 15, the charge accumulation regions are formed. Therefore, as shown in FIG. 2A and FIG. 2B, the phenomenon of the CBD can be prevented by separating the charge accumulation layers 16.

However, in the virtual ground flash memory of FIGS. 1A and 1B, the area below the word line 22 and between the bit lines 12 (e.g., B1 and B2) forms the channel region 24. Then, a charge accumulation region is formed in the charge accumulation layer 16 in the neighborhood of the bit line 12 in the lengthwise direction of the word line 22. Therefore, the method according to FIG. 2A and FIG. 2B used for the NAND flash memory cannot be used to separate the charge accumulation regions for the virtual ground flash memory.

SUMMARY

This summary is intended to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a semiconductor device comprising a bit line formed in a semiconductor substrate, a charge accumulation layer formed on the semiconductor substrate, a word line formed on the charge accumulation layer across the bit line, and a channel region formed in the semiconductor substrate below the word line and between the bit line and its adjacent bit line. For the semiconductor device, the charge accumulation layer is formed above the channel region in a widthwise direction of the word line, and a width of the word line is set to be narrower than a distance between an end of the channel region and a central part of the channel region in a lengthwise direction of the word line.

Another embodiment of the present invention is directed to a method for manufacturing a semiconductor device which comprises forming a bit line in a semiconductor substrate, and forming an oxide nitride oxide (ONO) film which includes a charge accumulation layer on the semiconductor substrate. The method further includes forming a word line across the bit line on the ONO film, forming a hole in the ONO film in a central part between the word line and its adjacent word line and between the bit line and its adjacent bit line, and isotropically etching the charge accumulation layer via the hole.

Yet another embodiment of the present invention is directed to a method for manufacturing a semiconductor device which comprises forming a bit line in a semiconductor substrate, and forming an oxide nitride oxide (ONO) film which includes a charge accumulation layer on the semiconductor substrate. In addition, the method includes forming a word line across the bit line on the ONO film, and forming a hole in the ONO film in a central part between the word tine and its adjacent word line and between the bit line and its adjacent bit line. Moreover, the method includes isotropically etching the charge accumulation layer via the hole by applying phosphoric acid to the hole to form a hollow section, wherein the hollow section is formed such that the bit line is connected to its adjacent bit line via a narrow path in a lengthwise direction of the word line.

As will be illustrated in the detailed description, other embodiments pertain to systems, methods, and devices for effectively separating adjacent charge accumulation layers in a mirror bit structure of a virtual ground flash memory. This is achieved by isolating a charge accumulation layer associated with a bit line from its neighboring charge accumulation layer associated with another bit line by etching portions of the two charge accumulation layers located above and between the two bit lines along the lengthwise direction of the word line. By doing so, the size of the memory can be scaled down without causing interference in charges stored in the charge accumulation layers.

BRIEF DESCRIPTION OF THE DRAWINGS

Example embodiments are illustrated by way of example and not limitation in the figures of the accompanying drawings, in which like references indicate similar elements and in which:

FIG. 4A and FIG. 4B are schematic top views of a virtual ground flash memory, according to the first embodiment.

FIG. 6A through FIG. 9D illustrate an exemplary method for manufacturing the virtual ground flash memory of FIG. 4A and FIG. 4B, according to the first embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to systems, methods, and devices for effectively separating adjacent charge accumulation layers in a mirror bit structure of a virtual ground flash memory. This is achieved by isolating a charge accumulation layer associated with a bitline from its neighboring charge accumulation layer associated with another bitline by etching portions of the two charge accumulation layers located above and between the two bitlines along the lengthwise direction of the word line. By doing so, the size of the memory can be scaled down without causing interference in charges stored in the charge accumulation layers.

First Embodiment

Figure 1A:
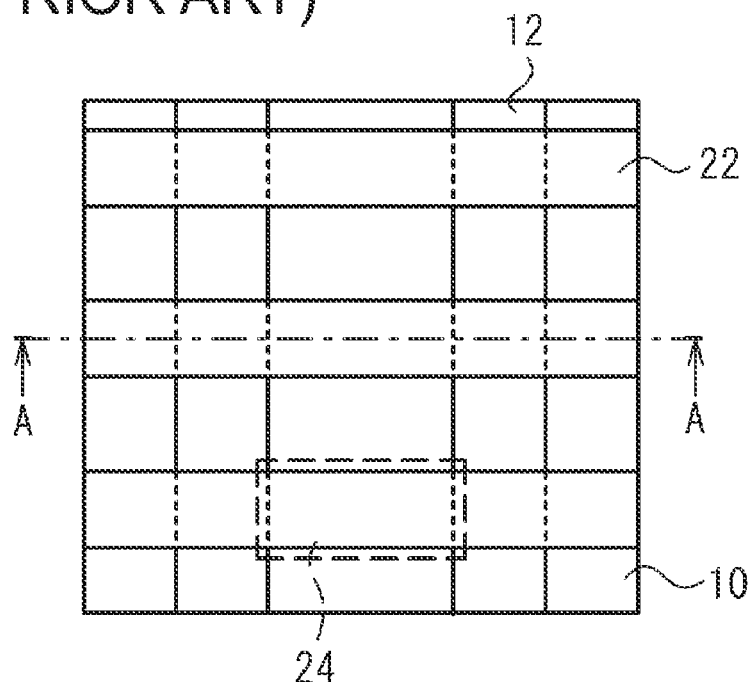
FIG. 1A is a schematic top view of a conventional flash memory.
Figure 1B:
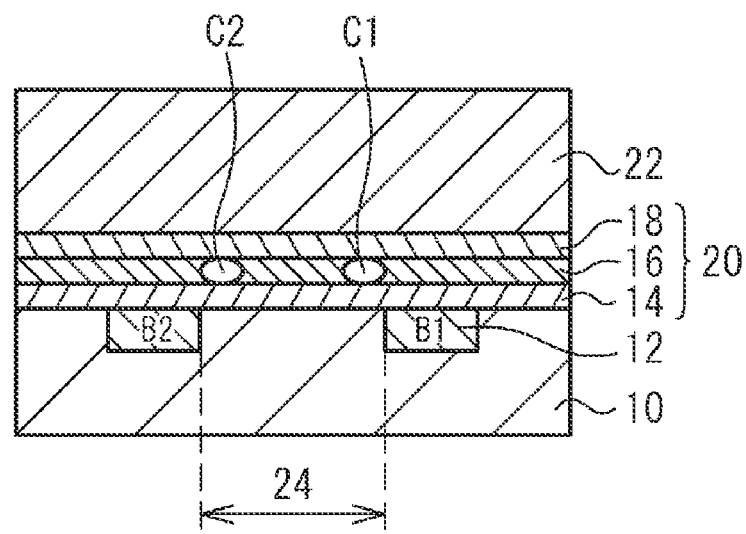
FIG. 1B is a schematic cross-sectional view taken along the line A-A of FIG. 1A.
Figure 2A:
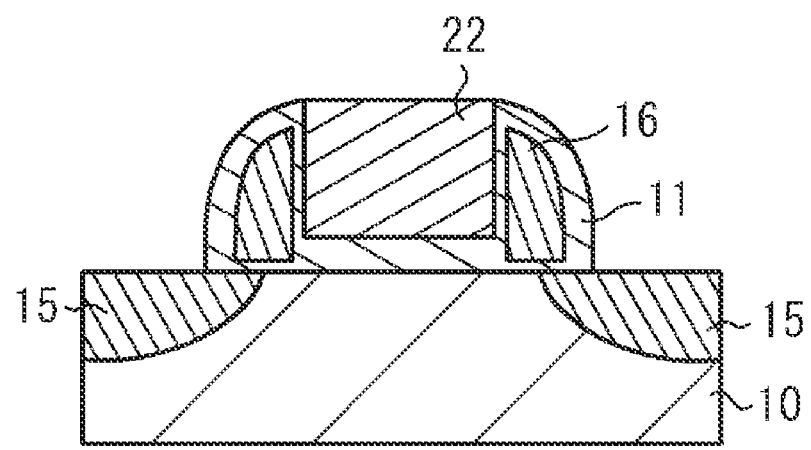
FIG. 2A and FIG. 2B describe cross sectional views of a NAND flash memory designed to prevent charges accumulated in charge accumulation regions from interfering with each other.
Figure 2B:
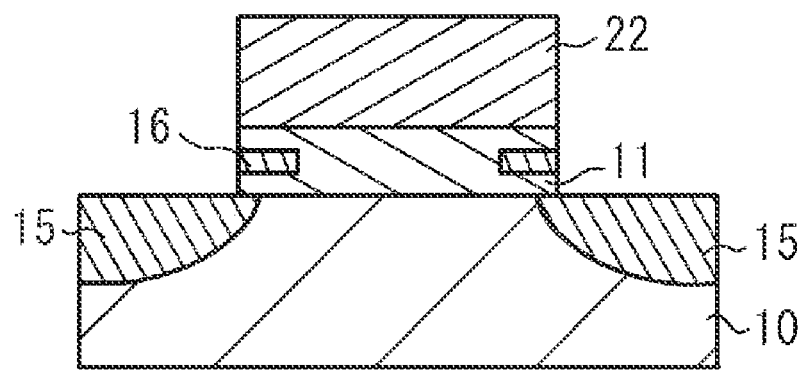
Figure 3:
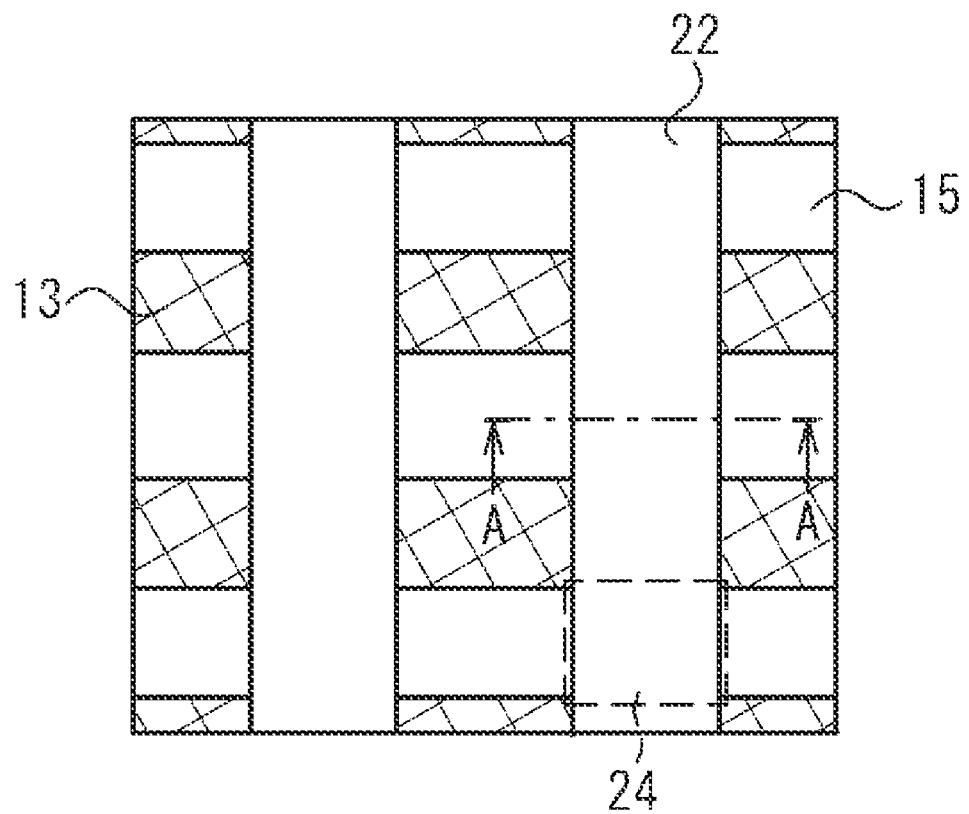
FIG. 3 is a schematic top view of the NAND flash memory illustrated in FIG. 2A and FIG. 2B.
Figure 5A:
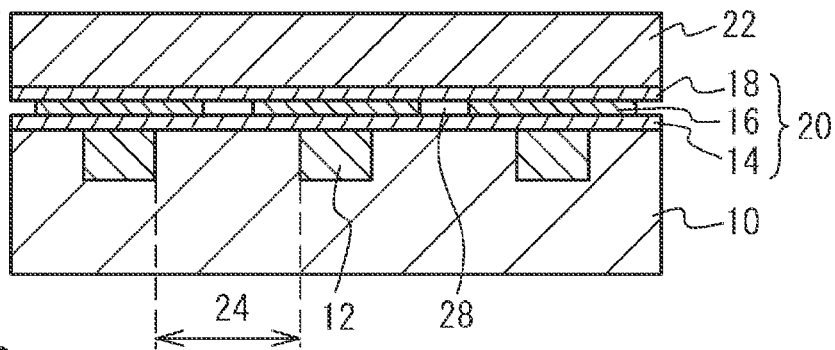
FIG. 5A, FIG. 5B, FIG. 5C, and FIG. 5D are schematic cross-sectional views taken along the line A-A, the line B-B, the line C-C, and the line D-D in FIG. 4A, respectively, according to the first embodiment.
Figure 5B:
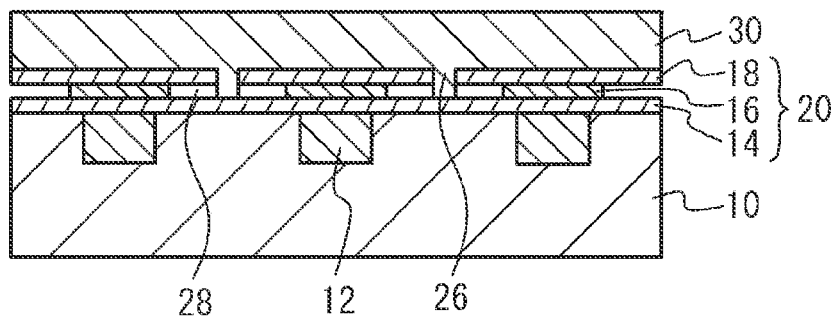
Figure 5C:
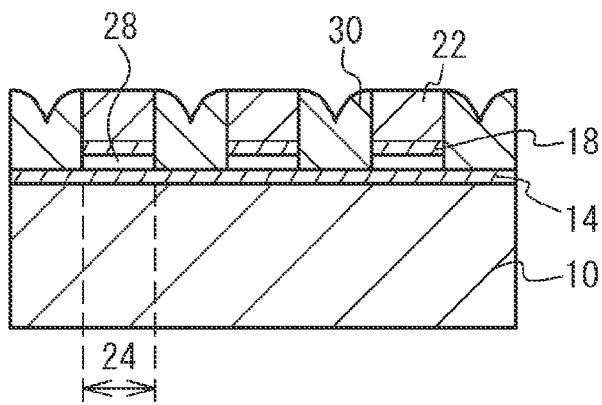
Figure 5D:
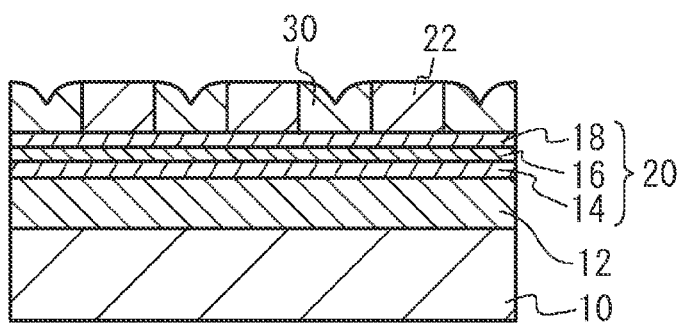

FIG. 4A and FIG. 4B are schematic top views of a virtual ground flash memory, according to the first embodiment. FIG. 5A is a schematic cross-sectional view taken along the line A-A in FIG. 4A, FIG. 5B is a schematic cross-sectional view taken along the line B-B in FIG. 4A, FIG. 5C is a schematic cross-sectional view taken along the line C-C in FIG. 4A, and FIG. 5D is a schematic cross-sectional view taken along the line D-D in FIG. 4A.

In FIG. 4A through FIG. 5D, the bit line 12 is formed in the semiconductor substrate 10 (e.g., a p-type silicon substrate), and an ONO film 20 is formed across the bit lines 12. In one exemplary implementation, the ONO film 20 includes the tunnel insulating film 14 made of a $SiO_2$ film, the charge accumulation layer 16 made of a SiN film, and the top insulating film 18 made of a $SiO_2$ film. The word line 22 is formed across the bit lines 12.

In FIG. 4A through FIG. 5C, the channel region 24 is formed between the neighboring bit lines 12. In FIG. 5B, holes 26 are formed in the central part of the top insulating film 18 between the word lines 22 and between the bit lines 12. In addition, the edges of the charge accumulation layer 16 are elliptically removed. Furthermore, a hollow section 28 adjoining to a side surface of the charge accumulation layer 16 is formed between the tunnel insulating film 14 and the top insulating film 18.

In FIG. 4A and FIG. 4B, by the elliptically formed hollow section 28, a width W of the charge accumulation layer 16 formed over the channel region 24 in the widthwise direction of the word line 22 is set to be narrower in a curved line from an end E of the channel region 24 towards a central part of the channel region 24 in the lengthwise direction of the word line 22. In other words, the length L1 of the charge accumulation layer 16 from the end E is longer than the length L2. Further, the charge accumulation layer 16 is separated by the central part of the channel region 24.

In FIG. 5B through FIG. 5D, the sidewall layer 30 made of a $SiO_2$ film is formed on the sidewall of the word line 22, and the hole 26 is also filled with the material used to form the sidewall layer 30.

Figure 6A:
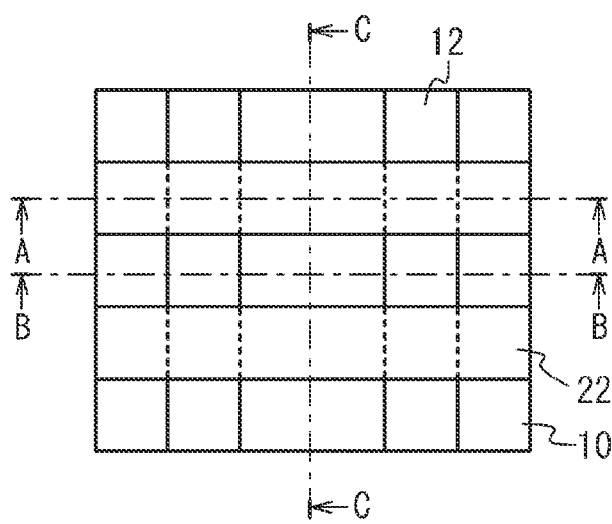
Figure 6B:
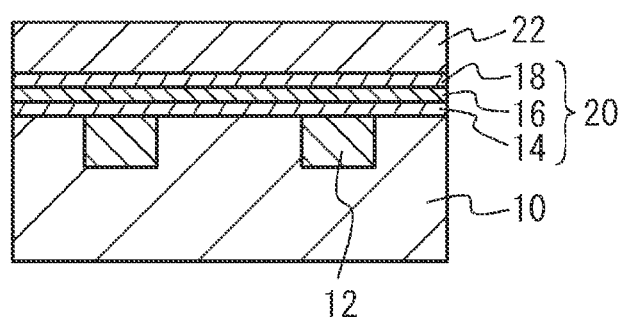
Figure 6C:
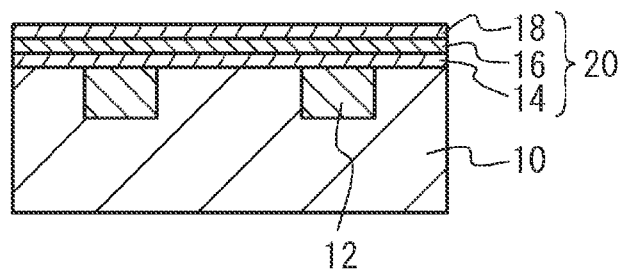
Figure 6D:
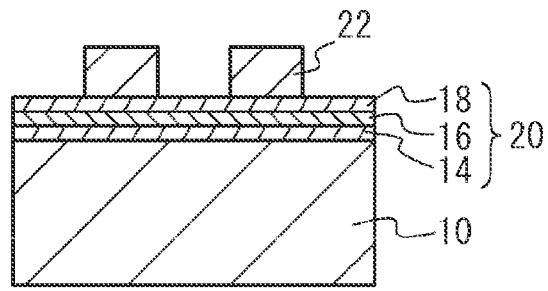
Figure 8A:
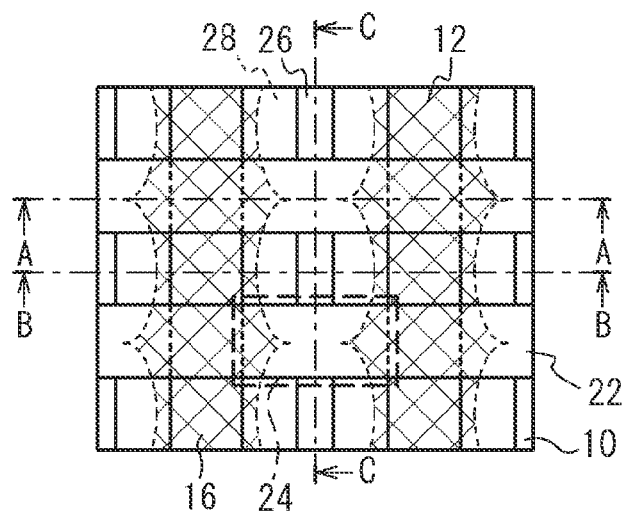
Figure 8B:
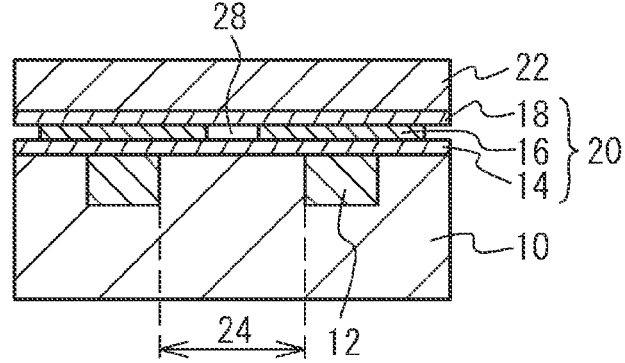
Figure 8C:
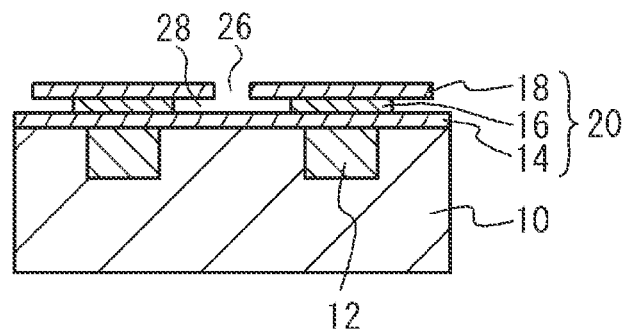
Figure 8D:
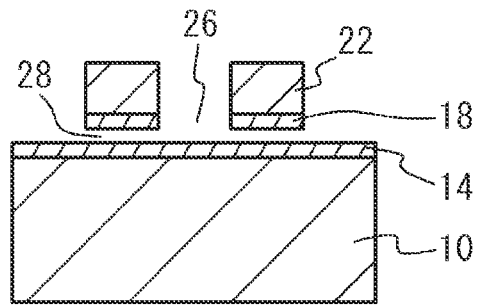
Figure 9A:
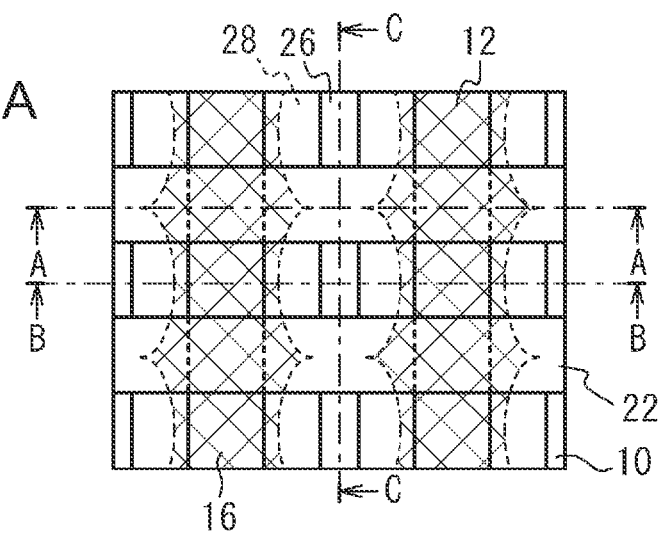
Figure 9B:
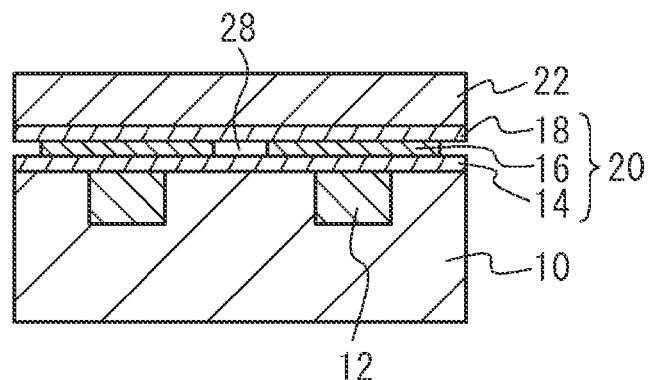
Figure 9C:
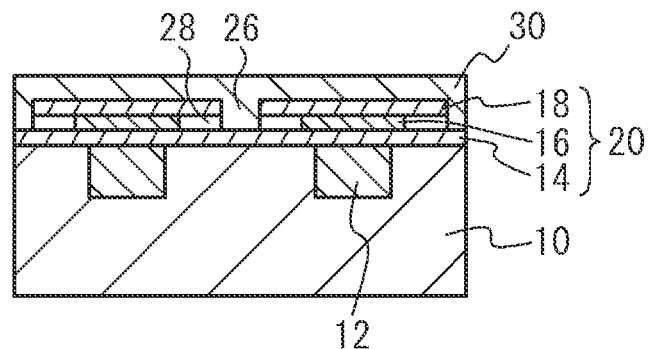
Figure 9D:
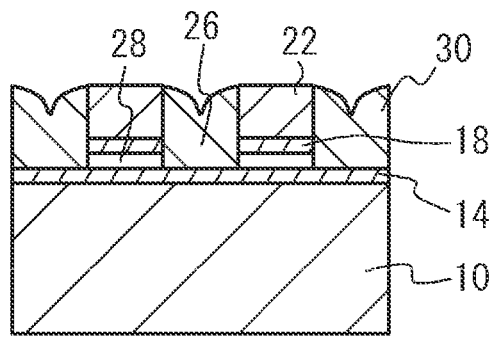

FIG. 6A through FIG. 9D illustrate an exemplary method for manufacturing the virtual ground flash memory, according to the first embodiment. In FIG. 6A, the bit line 12 is shown through the ONO film 20, and in FIG. 8A, the charge accumulation layer 16, which is a cross-hatched area in FIG. 8A, is shown through the word line 22 and the top insulating film 18. In FIG. 9A, the sidewall layer 30 is omitted in the drawing.

In FIG. 6A through FIG. 6D, an arsenic ion is implanted to the semiconductor substrate 10 of a p-type silicon substrate by implanting an arsenic ion. By heat-treating thereafter, the bit lines 12 (e.g., 70 nm wide) of an n-type diffusion domain is formed. On the semiconductor substrate 10, the tunnel insulating film 14 made of a 7 nm thick $SiO_2$ film, the charge accumulation layer 16 made of a 7 nm thick SiN film, and the top insulating film 18 made of a 10 nm thick $SiO_2$ are formed. To form the tunnel insulating film 14 and the top insulating film 18, a chemical vapor deposition (CVD) method or a thermal oxidation method can be used. To form the charge accumulation layer 16, a CVD method can be used. Consequently, on the semiconductor substrate 10, the ONO film 20 made of the tunnel insulating film 14, the charge accumulation layer 16, and the top insulating film 18 are formed. On the ONO film 20, the word line 22 (e.g., 60 nm wide) made of polysilicon is formed across the bit lines 12.

In FIG. 7A through FIG. 7D, a photoresist 32 coated on the ONO film 20 covers the word line 22. By subjecting the photoresist 32 to a resist-shrink process or a double-exposure process, a 30 nm wide opening is formed at the central part of the photoresist 32 between the bit lines 12. With the photoresist 32 as a mask, the top insulating film 18 is dry-etched by using a reactive ion etching (RIE) method. Consequently, a 30 nm wide hole 26 is formed at the central part of the photoresist 32 and the top insulating film 18. The hole 26 is formed an area between the word lines 22 and the bit lines 12. When etching the top insulating film 18, the word line 22 made of polysilicon is hardly etched although it is exposed to plasma.

In FIG. 8A through FIG. 8D, after the photoresist 32 is removed, with phosphoric acid at a temperature of, for example, 150 degrees Celsius as an etching solution, the phosphoric acid is applied to the hole 26 to remove the charge accumulation layer 16 so as to separate the charge accumulation layer 16 over the central part of the channel region 24 in the extending direction of the word line 22. As the wet etching with phosphoric acid is isotropic etching, the portion of the charge accumulation layer 16 adjacent to the hole 26 is elliptically removed. As a result, the hollow section 28 is formed between the tunnel insulating film 14 and the top insulating film 18. By the elliptically formed hollow section 28, the width of the charge accumulation layer 16 provided over the channel region 24 in the width direction of the word line 22 gets narrower in a curved line from the end of the channel region 24 towards the central part of the channel region 24 in the extending direction of the word line 22. When removing the charge accumulation layer 16 by applying the phosphoric acid to the hole 26, even though the tunnel insulating film 14 and the top insulating film 18 are also exposed to the phosphoric acid, as the selectivity ratio of a SiN film to a $SiO_2$ film is high as 100 or more, the tunnel insulating film 14 and the top insulating film 18 are hardly etched and remain as they are.

In FIG. 9A through FIG. 9D, a $SiO_2$ film is formed on the semiconductor substrate 10 to cover the word line 22. Thereafter, using a RIE method, the $SiO_2$ film is etched until the top surface of the word line 22 is exposed. Consequently, on the sidewall of the word line 22, the sidewall layer 30 made of the $SiO_2$ film is formed. Further, the sidewall layer 30 is also formed in the hole 26 and in the central part between the bit lines 12.

According to the first embodiment, as shown in FIG. 4, the width W of the charge accumulation layer 16 formed over the channel region 24 in the widthwise direction of the word line 22 is set to be narrower in a curved line from the end E of the channel region 24 towards the central part of the channel region 24 in the lengthwise direction of the word line 22. Further, the charge accumulation layers 16 are separated by the central part of the channel region 24 in the lengthwise direction of the word line 22. Therefore, the charge accumulation regions formed in the neighborhood of the bit line 12 in the channel region 24 can be separated. Further, the separated charge accumulation layer 16 is adjoined to the hollow section 28 provided between the tunnel insulating film 14 and the top insulating film 18. Therefore, the charges accumulated in the charge accumulation regions are not easily moved. Consequently, even when the space between the bit lines 12 is narrowed, the charges accumulated in the charge accumulation regions can be prevented from interfering with each other.

Figure 10:
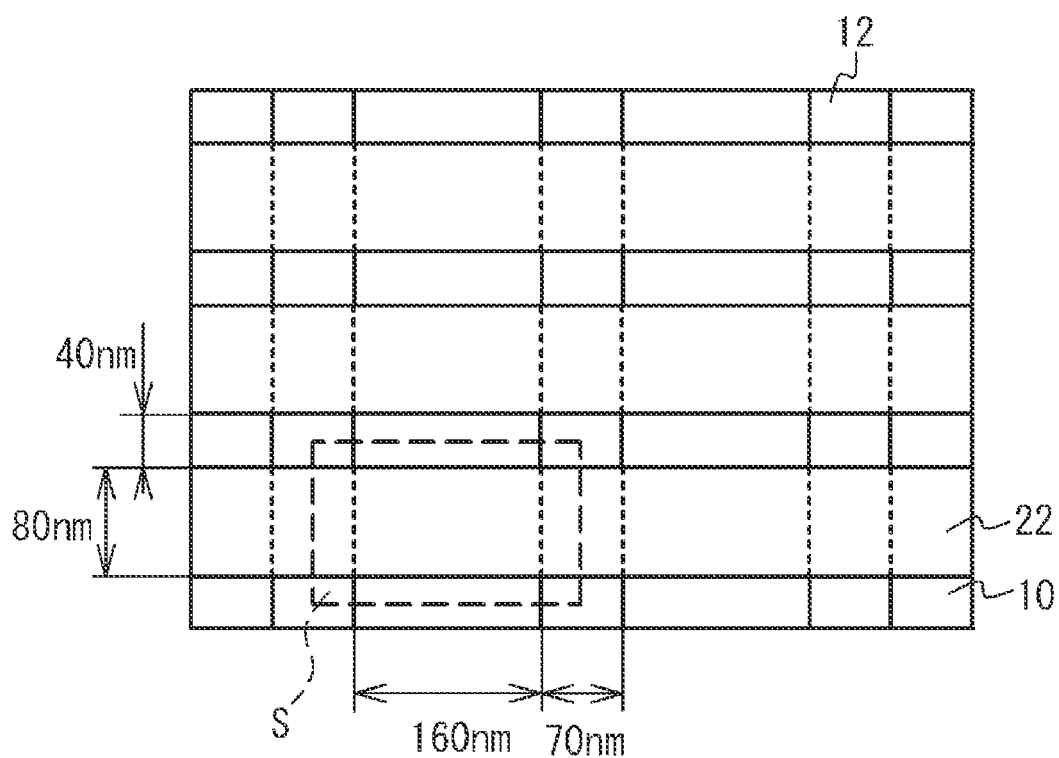
FIG. 10 illustrates the size of the memory cell of the conventional virtual ground flash memory.
Figure 11:
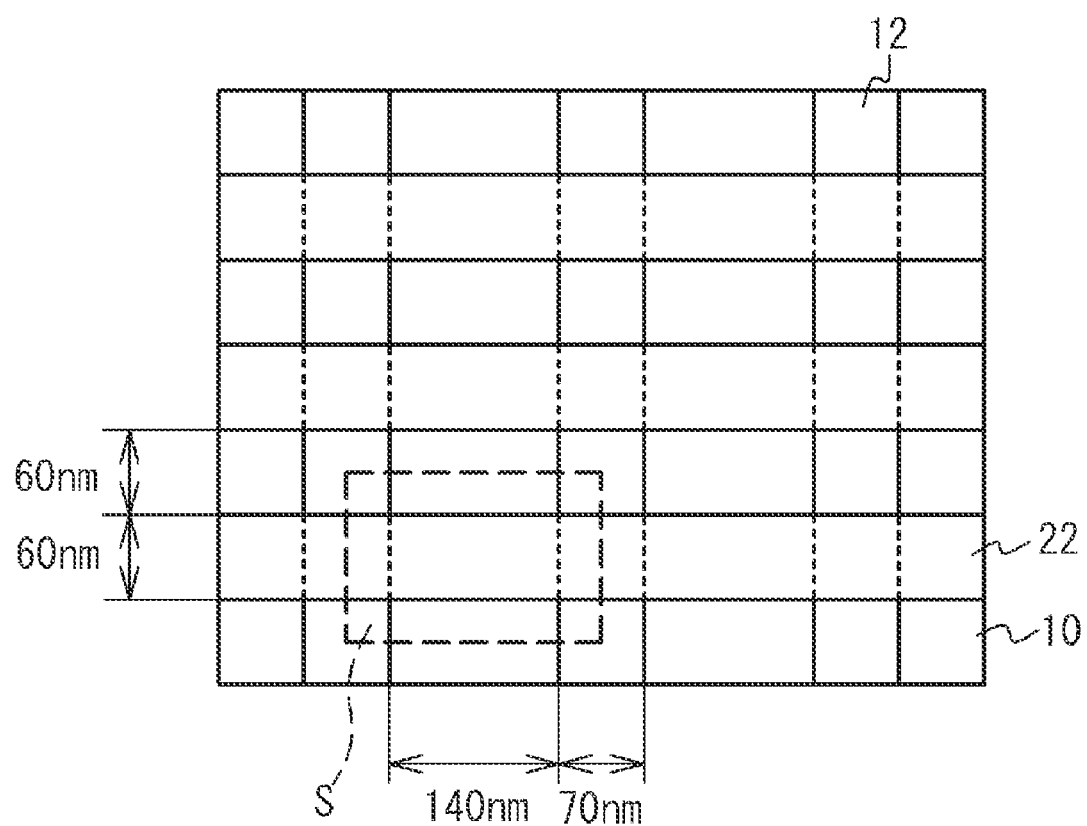
FIG. 11 illustrates the size of the memory cell of an exemplary virtual ground flash memory, according to the first embodiment.

FIG. 10 illustrates the size of the memory cell S of the conventional virtual ground flash memory. FIG. 11 illustrates the size of the memory cell S of an exemplary virtual ground flash memory, according to the first embodiment. In FIG. 10, while the size of the memory cell S is 230 nm wide by 120 nm long, in the virtual ground flash memory of the first embodiment, as shown in FIG. 11, the size of the memory cell S can be miniaturized down to, for example, 210 nm wide by 120 nm long.

Figure 12:
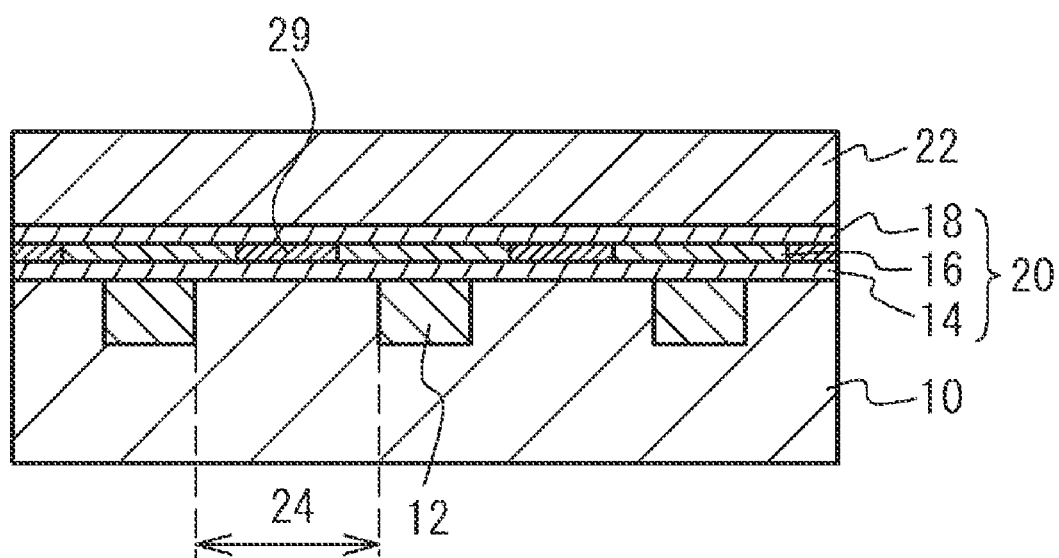
FIG. 12 is a schematic cross-sectional view of an exemplary virtual ground flash memory, according to the second embodiment.

Furthermore, in the first embodiment, as shown in FIG. 4A, FIG. 4B, and FIG. 5A, the charge accumulation layer 16 is formed over the channel region 24 adjoining the hollow section 28 flanked by the tunnel insulating film 14 and the top insulating film 18. However, as shown in FIG. 12, in place of the hollow section 28, an insulating film 29 made of a $SiO_2$ film can be formed. In this case, as the charges accumulated in the charge accumulation regions become difficult to move around, it can prevent the charges accumulated in the charge accumulation regions from interfering with each other. Furthermore, another type of the insulating film 29 besides $SiO_2$ film can be used.

The insulating film 29 can be formed by filling the insulating film 29 into the hollow section 28 after etching the charge accumulation layer 16 to form the hollow section 28 as shown in FIG. 8A through FIG. 8D. Although the charge accumulation layer 16 made of a SiN film is described, it is not limited to this. Other materials similar to the SiN film can be used as long as the charges can be locally accumulated. Furthermore, as shown in FIG. 5B, while the example of the hole 26 filled with the sidewall layer 30 is described, the hole 26 can remain as it is without filling it with the sidewall layer 30.

In FIG. 6A through FIG. 6D, the bit line 12 is formed in the semiconductor substrate 10. The ONO film 20 made of the tunnel insulating film 14, the charge accumulation layer 16, and the top insulating film 18 are formed on the semiconductor substrate 10. The word line 22 is formed across the bit lines 12. Next, FIG. 7A through FIG. 7D, by etching the central part of the top insulating film 18 between the word lines 22 and between the bit lines 12, the hole 26 is formed. Thereafter, as shown in FIG. 8A through FIG. 8D, with phosphoric acid as the etching solution, the charge accumulation layer 16 is isotropically etched from the hole 26. By this manufacturing method, the width of the charge accumulation layer 16 formed over the channel region 24 in the widthwise direction of the word line 22 becomes narrower in a curved line from the end of the channel region 24 towards the central part of the channel region 24 in the lengthwise direction of the word line 22. The charge accumulation layer 16 is then formed above the channel region 24 in the lengthwise direction of the word line 22. Consequently, the semiconductor device which prevents the charges accumulated in the charge accumulation regions from interfering with each other.

Particularly, the wet etching using phosphoric acid can control an etching rate of the charge accumulation layer 16 by controlling the temperature of phosphoric acid. More specifically, the etching amount of the charge accumulation layer 16 can be controlled by controlling the temperature of phosphoric acid. Therefore, by controlling the temperature of the phosphoric acid, two adjoining charge accumulation regions can be separated by etching the portion of the charge accumulation layer 16 formed above the central part of the channel region 24 in the lengthwise direction of the word line 22.

In FIG. 6A through FIG. 6D, the ONO film 20 and the word line 22 are formed on the semiconductor substrate 10. In FIG. 7A through FIG. 7D, the hole 26 is formed in the top insulating film 18 by etching the top insulating film 18 in a self-aligning manner with respect to the word line 22. More specifically, the top insulating film 18 directly below the word line 22 can be maintained. Further, in FIG. 8A through FIG. 8D, the charge accumulation layer 16 may be etched using other isotropic etchings such as chemical dry etching.

Second Embodiment

Figure 13:
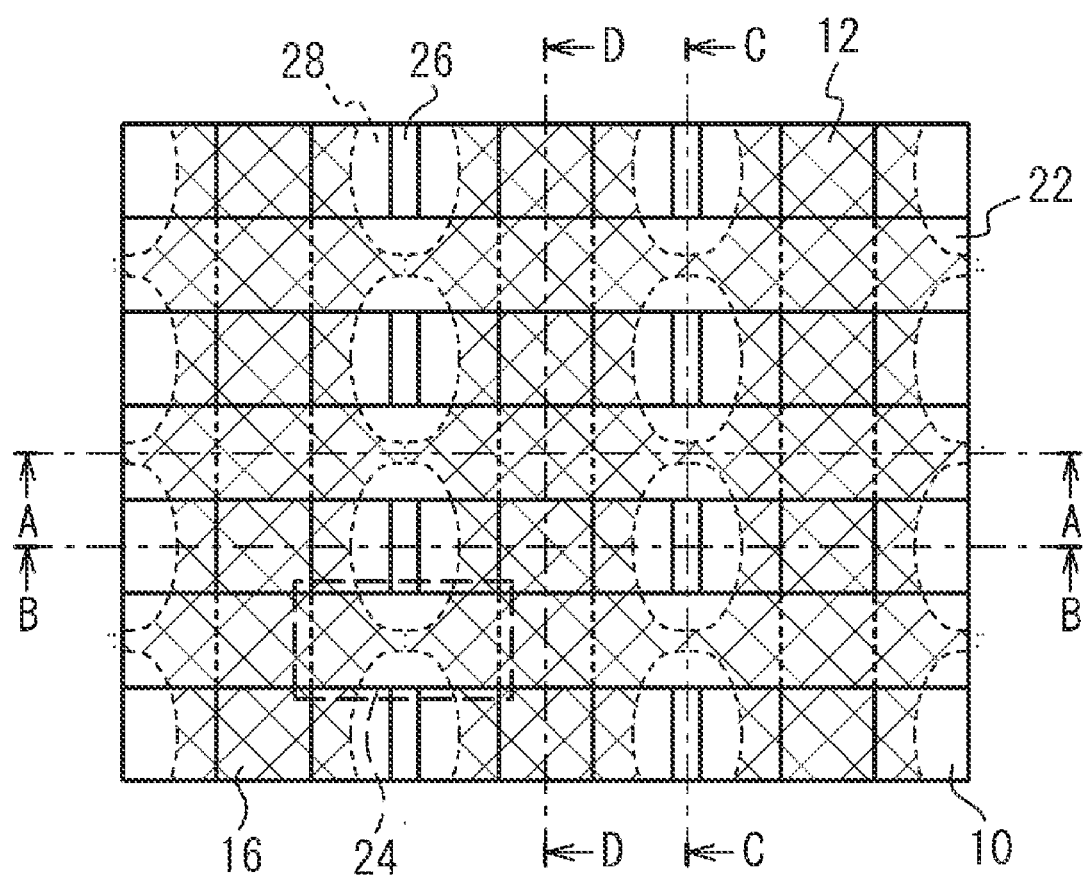
FIG. 13 is a schematic top view of the virtual ground flash memory of FIG. 12, according to the second embodiment.
Figure 14A:
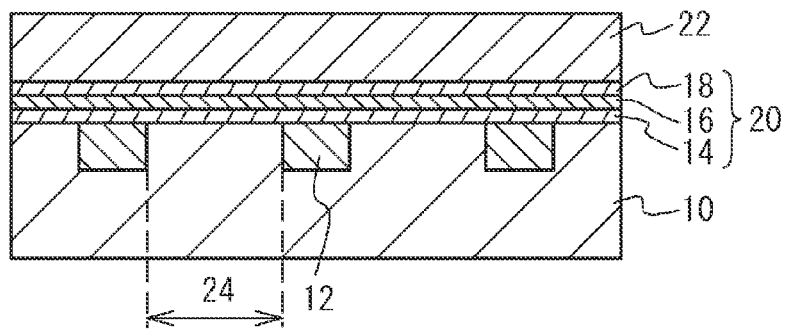
FIG. 14A through FIG. 14D are schematic cross-sectional views taken along the line A-A, the line B-B, the line C-C, and the line D-D in FIG. 13, respectively, according to the second embodiment.
Figure 14B:
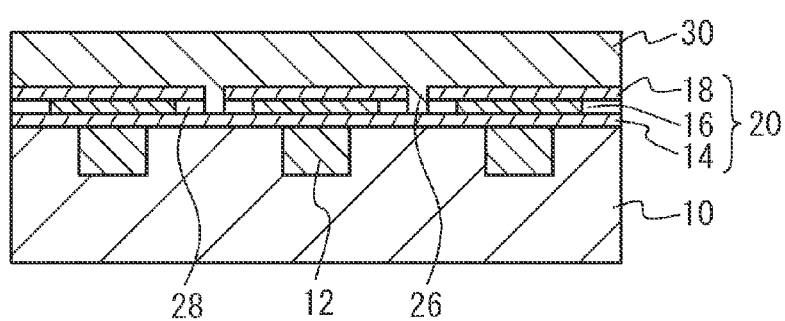
Figure 14C:
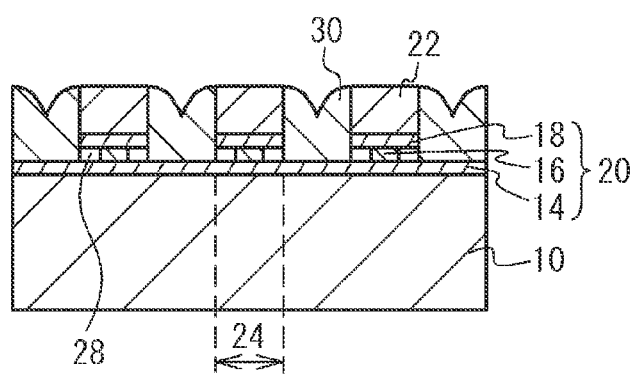
Figure 14D:
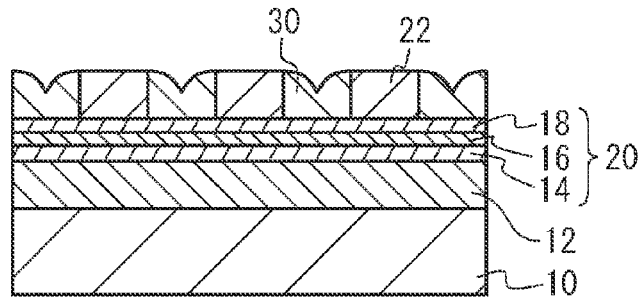

FIG. 13 is a schematic top view of the virtual ground flash memory of FIG. 12, according to the second embodiment. FIG. 14A is a schematic cross-sectional view taken along the line A-A in FIG. 13, FIG. 14B is a schematic cross-sectional view taken along the line B-B in FIG. 13, FIG. 14C is a schematic cross-sectional view taken along the line C-C FIG. 13, and FIG. 14D is a schematic cross-sectional view taken along the line D-D in FIG. 13. In FIG. 13, the charge accumulation layer 16, which is a cross-hatched area, is shown through the word line 22, the sidewall layer 30 and the top insulating film 18. In addition, the bit line 12 is shown through the ONO film 20 and the sidewall layer 30, and the hole 26 is shown through the sidewall layer 30.

FIG. 13 through FIG. 14D, over the central part of the channel region 24 in the lengthwise direction of the word line 22, the charge accumulation layer 16 is not separated. The manufacturing method for the virtual ground flash memory of the second embodiment is similar to that of the first embodiment except in few areas. For example, during the process of etching the charge accumulation layer 16 as shown in FIG. 8A through FIG. 8D, the charge accumulation layer 16 is etched to make the width of the charge accumulation layer 16 narrow in the widthwise direction of the word line 22 while separating adjacent charge accumulation layers 16 over the central part of the channel region 24 in the lengthwise direction of the word line 22.

However, in the second embodiment, as shown in FIG. 13 through FIG. 14D, over the central part of the channel region 24 in the lengthwise direction of the word line 22, the charge accumulation layer 16 is not being separated. When the width of the charge accumulation layer 16 in the widthwise direction of the word line 22 is sufficiently narrow, the charges accumulated in the charge accumulation regions become unable to move. Consequently, even when the space between the bit lines 12 is narrowed, the charges accumulated in the charge accumulation regions can be prevented from interfering with each other and can promote high integration and miniaturization of memory cells.

The previous description of the disclosed embodiments is formed to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device comprising:
    a bit line formed in a semiconductor substrate;
    a charge accumulation layer formed on the semiconductor substrate;
    a word line formed on the charge accumulation layer and across the bit line; and
    a channel region formed in the semiconductor substrate below the word line and between the bit line and an adjacent bit line, wherein the charge accumulation layer is formed above the channel region in a widthwise direction of the word line, and wherein a width of the word line is set to be narrower than a distance between an end of the channel region and a central part of the channel region in a lengthwise direction of the word line.

2. The semiconductor device of claim 1, wherein a portion of the charge accumulation layer formed above the central part of the channel region is removed in the lengthwise direction of the word line to separate the charge accumulation layer from a neighboring charge accumulation layer.

3. The semiconductor device of claim 1, further comprising:
    a tunnel insulating film formed between the semiconductor substrate and the charge accumulation layer; and
    a top insulating film formed on the charge accumulation layer, wherein the charge accumulation layer is adjoined to a hollow section formed between the charge accumulation layer and its neighboring charge accumulation layer.

4. The semiconductor device of claim 3, wherein the hollow section is filled with an insulating material.

5. The semiconductor device of claim 1, wherein the charge accumulation layer comprises a nitride film.

6. A semiconductor device comprising:
    a bit line formed in a semiconductor substrate;
    a charge accumulation layer formed on the semiconductor substrate;
    a word line formed on the charge accumulation layer and across the bit line; and
    a channel region formed in the semiconductor substrate below the word line and between the bit line and an adjacent bit line, wherein the charge accumulation layer is formed above the channel region in a widthwise direction of the word line, and wherein a first width of the charge accumulation layer above the channel region is greater than a second width of the charge accumulation layer above the channel region.

7. The semiconductor device of claim 6, wherein a portion of the charge accumulation layer formed above a central part of the channel region is removed in the lengthwise direction of the word line to separate the charge accumulation layer from a neighboring charge accumulation layer.

8. The semiconductor device of claim 6, further comprising:
    a tunnel insulating film formed between the semiconductor substrate and the charge accumulation layer; and
    a top insulating film formed on the charge accumulation layer, wherein the charge accumulation layer is adjoined to a hollow section formed between the charge accumulation layer and its neighboring charge accumulation layer.

9. The semiconductor device of claim 8, wherein the hollow section is filled with an insulating material.

10. The semiconductor device of claim 6, wherein the charge accumulation layer comprises a nitride film.

11. The semiconductor device of claim 6, wherein a width of the charge accumulation layer formed over the channel region in the widthwise direction of the wordline is set to be narrower in a curved line from an end of the channel region towards a central part of the channel region in the lengthwise direction of the wordline.

12. The semiconductor device of claim 6, wherein a portion of the charge accumulation layer formed above a central part of the channel region is removed in the lengthwise direction of the word line such that the charge accumulation layer is not separated from a neighboring charge accumulation layer.

* * * * *